(12) United States Patent
Wang

(10) Patent No.: US 6,647,603 B2
(45) Date of Patent: Nov. 18, 2003

(54) PROCESS FOR MANUFACTURING ELECTRONIC DEVICE PACKAGES

(75) Inventor: Robert Wang, Tao-Yuan Hsien (TW)

(73) Assignee: Ceramate Technical Co., Ltd., Tao-Yuan Hsien (TW)

( * ) Notice: Subject to any disclaimer, the term of this patent is extended or adjusted under 35 U.S.C. 154(b) by 124 days.

(21) Appl. No.: 09/985,670

(22) Filed: Nov. 5, 2001

(65) Prior Publication Data

US 2003/0084565 A1 May 8, 2003

(51) Int. Cl.[7] .................................................. H01G 7/00
(52) U.S. Cl. ...................................................... 29/25.42
(58) Field of Search ........................ 29/827, 854, 879, 29/889, 843, 25.42, 612

(56) References Cited

U.S. PATENT DOCUMENTS

| 4,497,012 A | * | 1/1985 | Gottlieb et al. |
| 4,631,824 A | * | 12/1986 | King |
| 4,639,988 A | * | 2/1987 | Goto et al. |
| 4,785,533 A | * | 11/1988 | Seino et al. |
| 4,989,318 A | * | 2/1991 | Utunomiya et al. |
| 5,060,117 A | * | 10/1991 | Dorlane et al. |
| 5,307,929 A | * | 5/1994 | Seidler |
| 5,867,895 A | * | 2/1999 | Beneden et al. |

* cited by examiner

Primary Examiner—Carl J. Arbes
(74) Attorney, Agent, or Firm—Baker Botts L.L.P.

(57) ABSTRACT

A process for manufacturing electronic device packages includes a step of forming a metal sheet into a runner part and a plurality of spaced apart terminal parts. The runner part extends in a longitudinal direction. The terminal parts are connected to the runner part and are aligned in the longitudinal direction. Each of the terminal parts includes a pair of spaced apart connecting legs that have lower inserting sections connected to the runner part, and upper soldering sections which extend from the lower inserting sections and which are offset from each other in a transverse direction relative to the longitudinal direction so as to define an inserting gap therebetween. The process further includes the steps of positioning an electronic element in the gap in each terminal part, and respectively connecting the upper soldering sections to two opposite side faces of the electronic element.

4 Claims, 9 Drawing Sheets

PROCESS FOR MANUFACTURING ELECTRONIC DEVICE PACKAGES

BACKGROUND OF THE INVENTION

1. Field of the Invention

The invention relates to a process for manufacturing electronic device packages, more particularly to a process for manufacturing electronic device packages that facilitates automation and mass-production and that is cost-effective.

2. Description of the Related Art

A conventional electronic device package, such as a surge suppressor, a Y-type capacitor, a negative temperature coefficient (NTC) thermistor or a positive temperature coefficient (PTC) thermistor, is shown in FIG. 1. The process for manufacturing the conventional electronic device package comprises the steps of forming two electrode layers 2 on two opposite side faces of an electronic element 1, soldering upper sections of two connecting legs 3 onto the electrode layers 2 on the side faces of the electronic element 1, and forming an insulating layer 4 on the electronic element 1 in a manner that the insulating layer 4 encloses the electronic element 1 and the upper sections of the connecting legs 3 so as to produce the electronic device package.

However, the aforementioned manufacturing process suffers from the following drawbacks:

1. Since the connecting legs 3 of the electronic device packages are formed individually, a batch of connecting legs 3 are manually arranged and are adhered onto an adhesive tape (not shown) prior to disposing and soldering of the connecting legs 3 onto the electronic elements 1. The adhesive tape is removed thereafter. Therefore, the aforementioned process is complicated and laborious and can not be mass-produced with the use of an automatic apparatus.

2. Since the connecting legs 3 are formed as circular metal conductive wires, the contacting areas between the connecting legs 3 and the electronic elements 1 are relatively small, thereby resulting in an insufficient soldering effect. Even though the upper sections of the connecting legs 3 could be pressed into a flat form, an additional step is required and the contacting areas between the connecting legs 3 and the electronic elements 1 are still insufficient for effective soldering.

SUMMARY OF THE INVENTION

Therefore, the object of the present invention is to provide a process for manufacturing electronic device packages with stable qualities and superior soldering effects.

According to the present invention, a process for manufacturing electronic device packages comprises the steps of:
preparing a plurality of electronic elements, each of which has two opposite side faces and each of which is formed with two electrode layers on the side faces, respectively;
preparing a metal sheet extending in a longitudinal direction;
forming the metal sheet into a runner part that extends in the longitudinal direction, and a plurality of spaced apart terminal parts that are connected to the runner part and that are aligned in the longitudinal direction, each of the terminal parts including a pair of spaced apart connecting legs that have lower inserting sections connected to the runner part, and upper soldering sections which extend from the lower inserting sections and which are offset from each other in a transverse direction relative to the longitudinal direction so as to define an inserting gap therebetween;
positioning each of the electronic elements into the inserting gap in a respective one of the terminal parts in a manner that the upper soldering sections of the connecting legs of the respective one of the terminal parts confront the electrode layers on the side faces of the electronic element, respectively; and
respectively connecting the side faces of each of the electronic elements to the upper soldering sections of the connecting legs of the respective one of the terminal parts via soldering.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
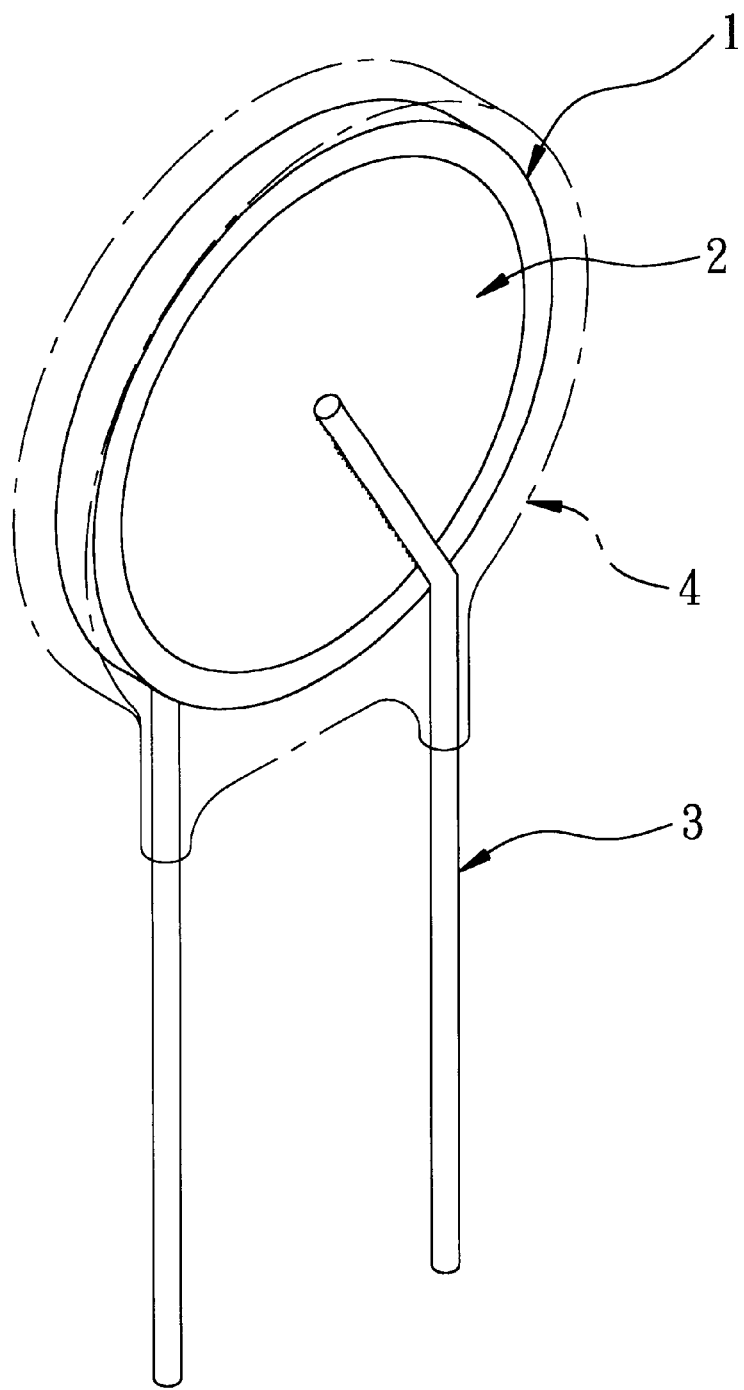
FIG. 1 is a perspective view of a conventional electronic device package.
Figure 2:
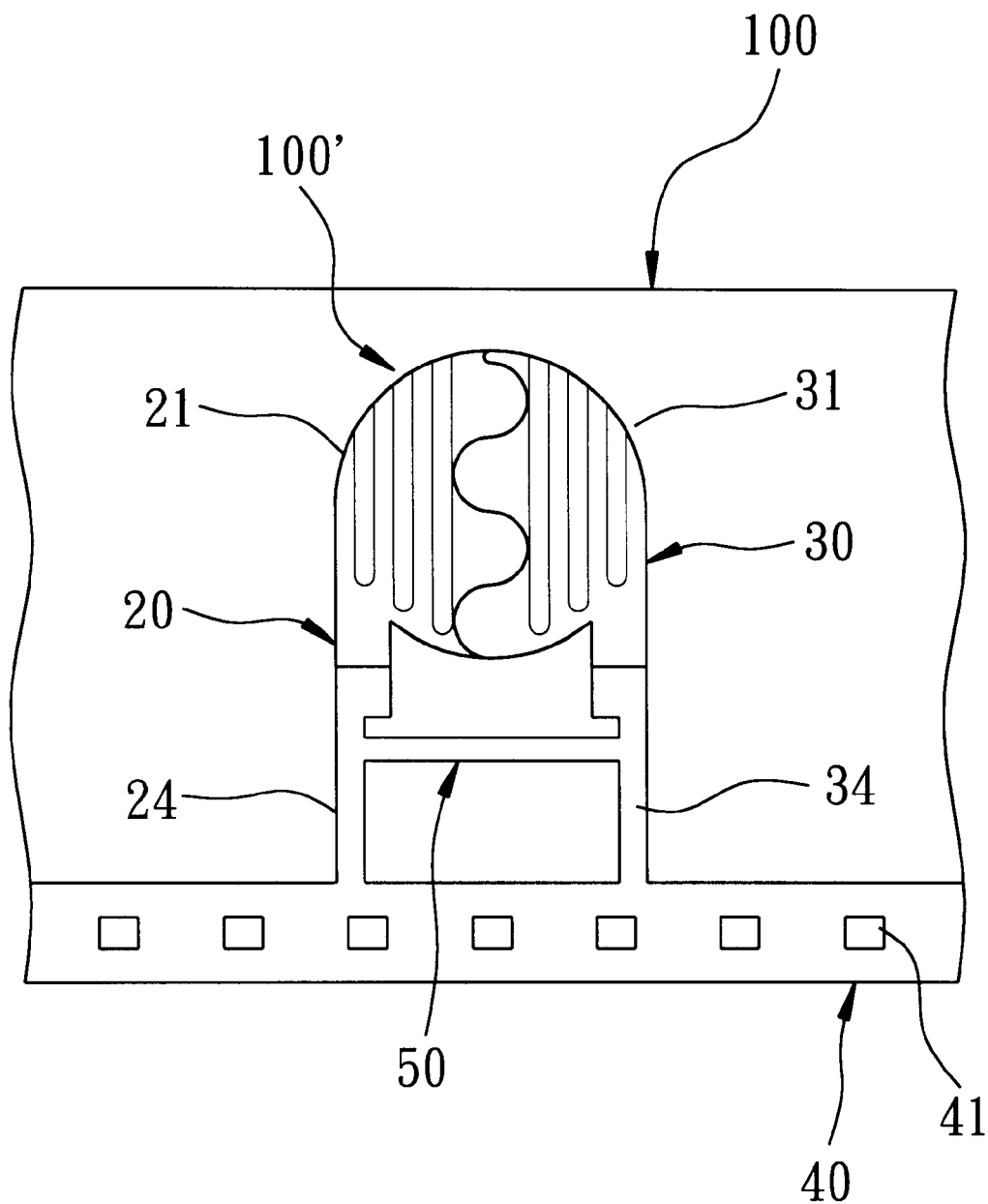
FIGS. 2 to 6 illustrate consecutive steps of a preferred embodiment of the process for manufacturing electronic device packages according to this invention.
Figure 3:
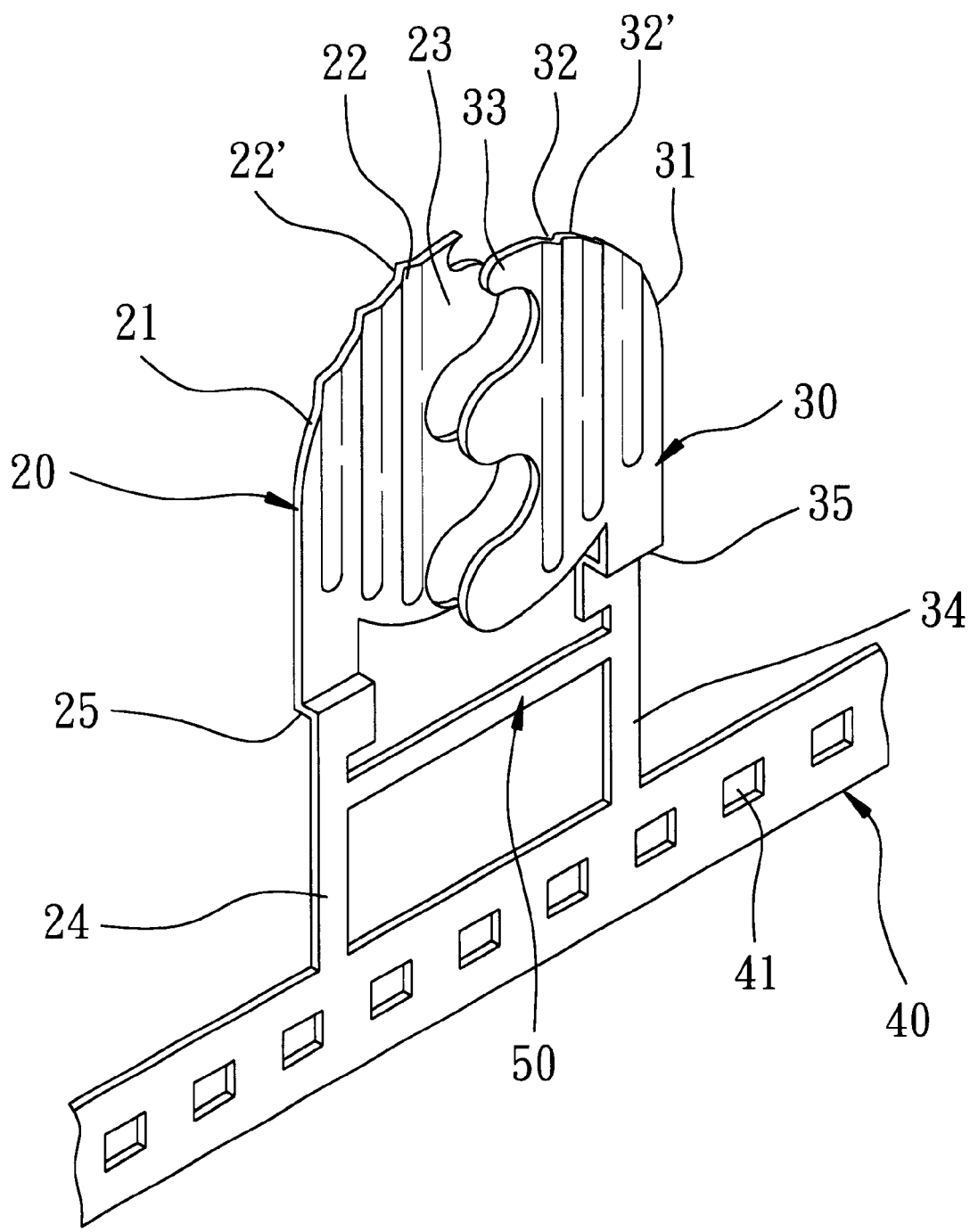
Figure 4:
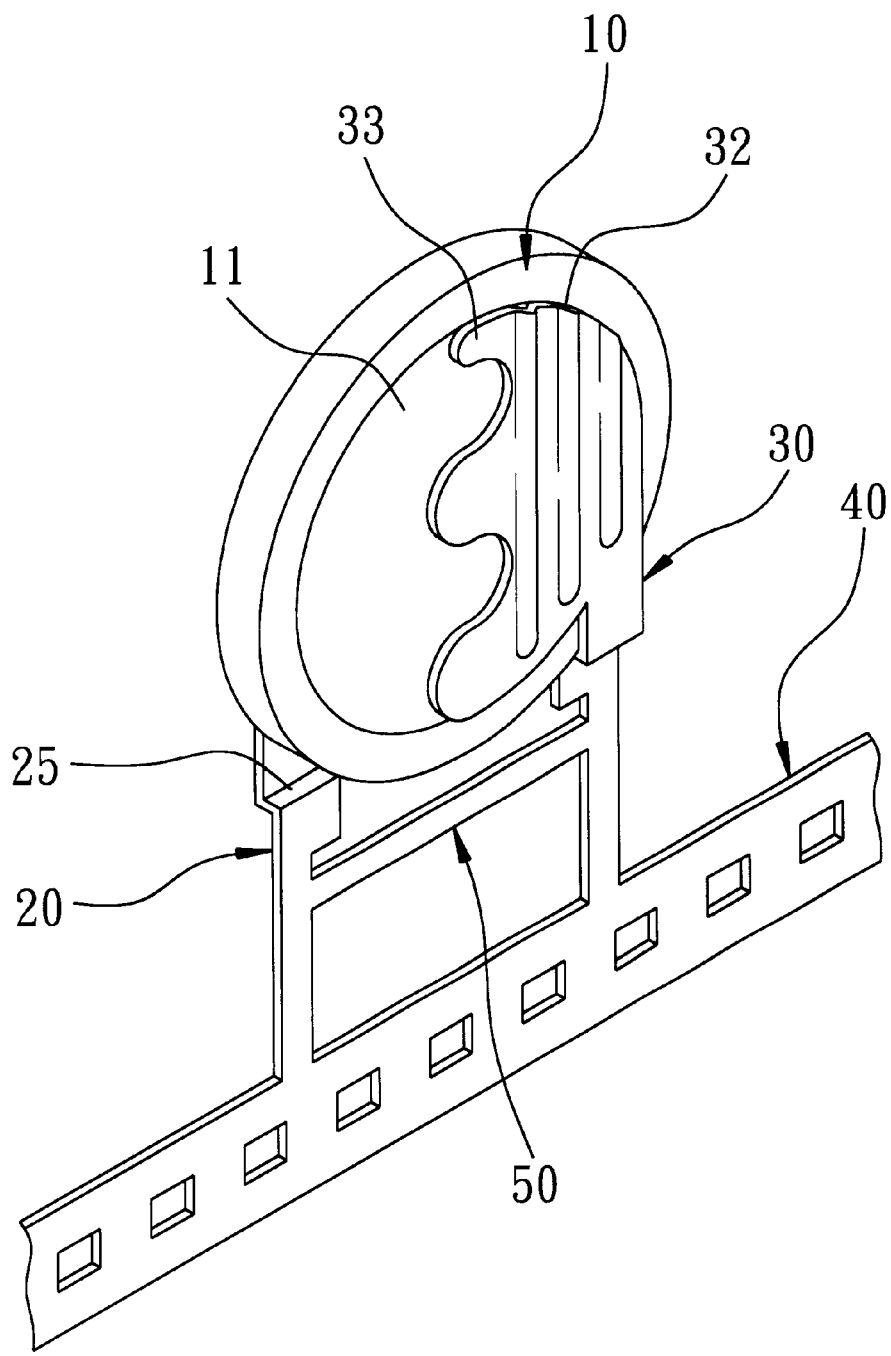
Figure 5:
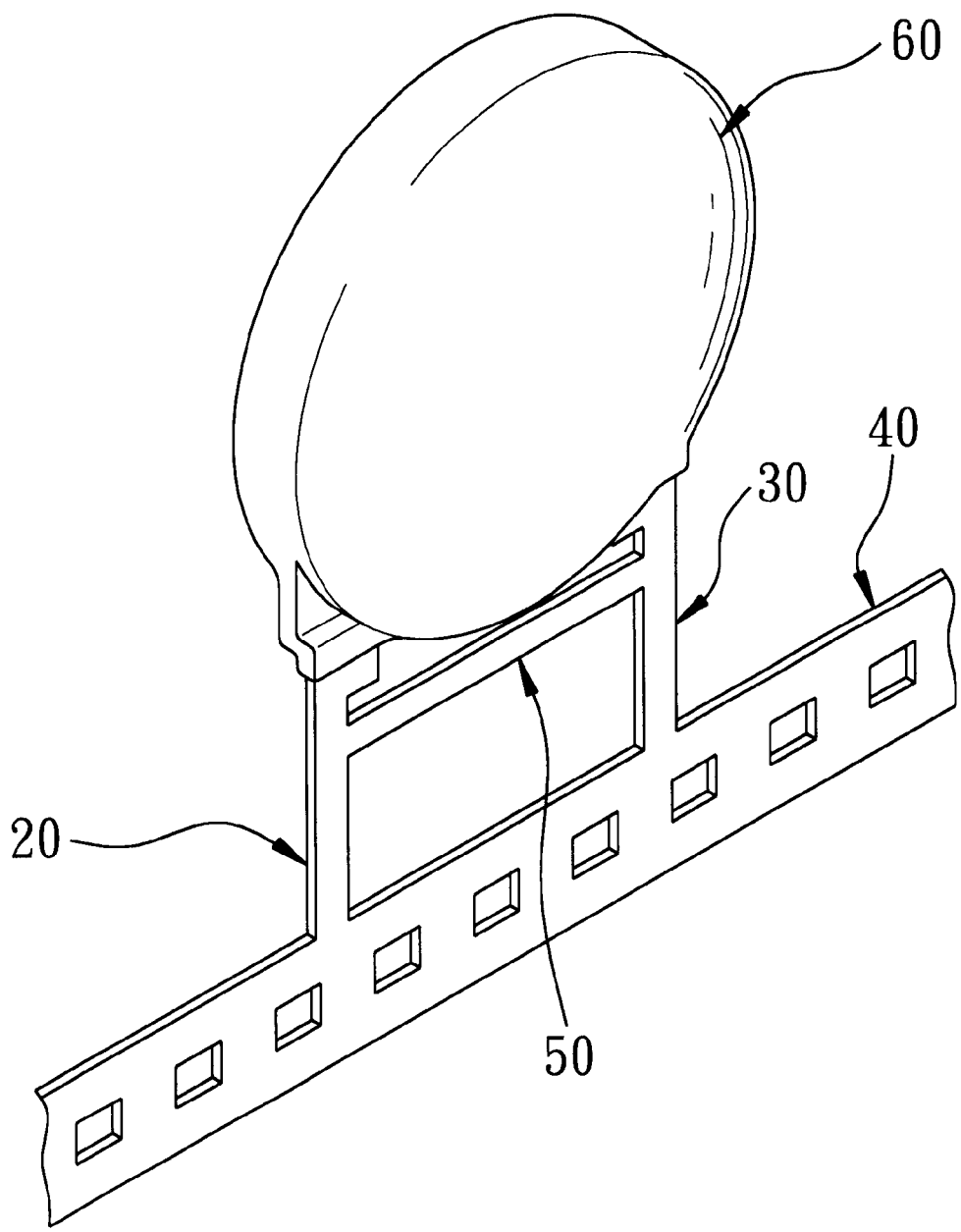
Figure 6:
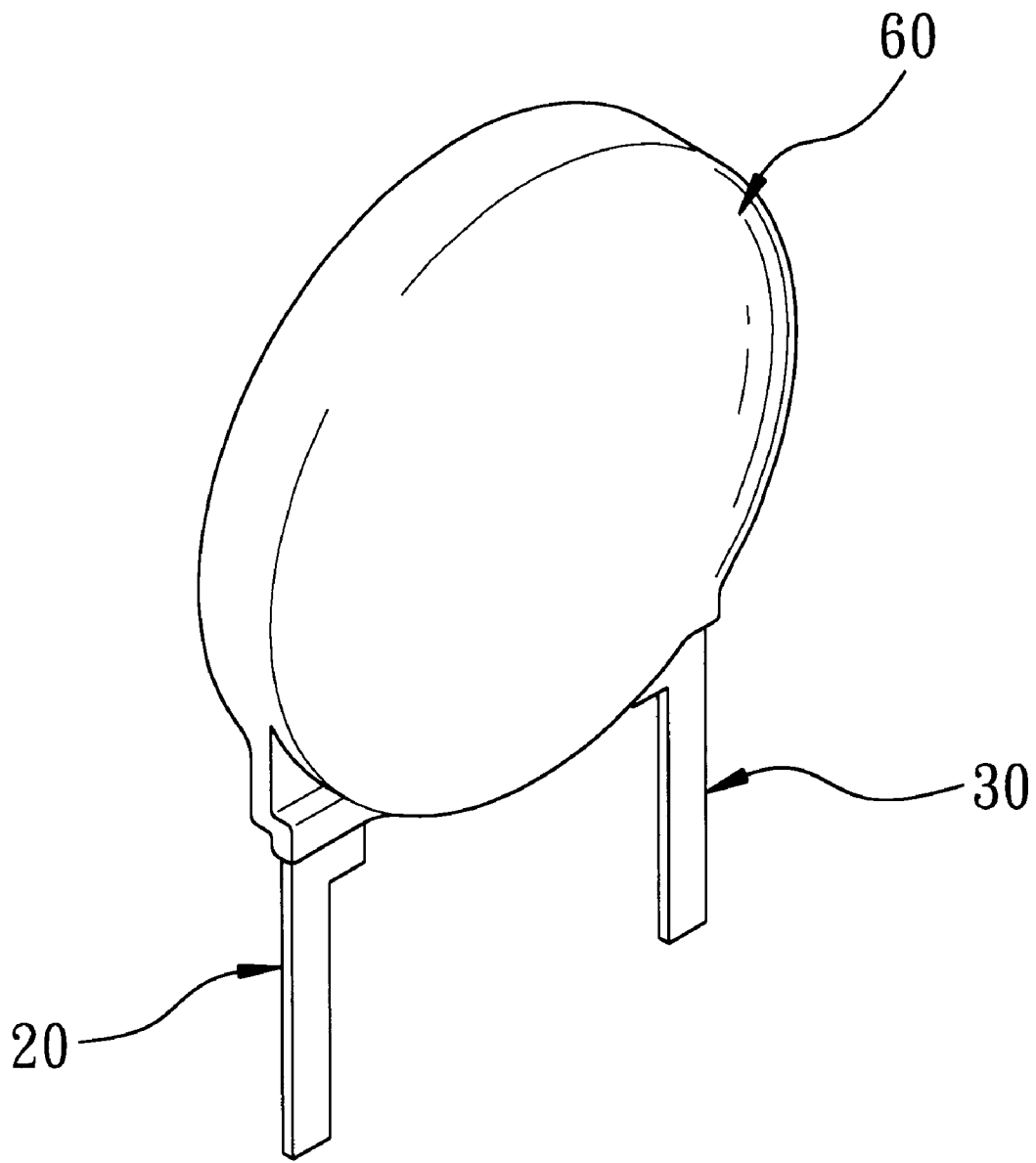
Figure 7:
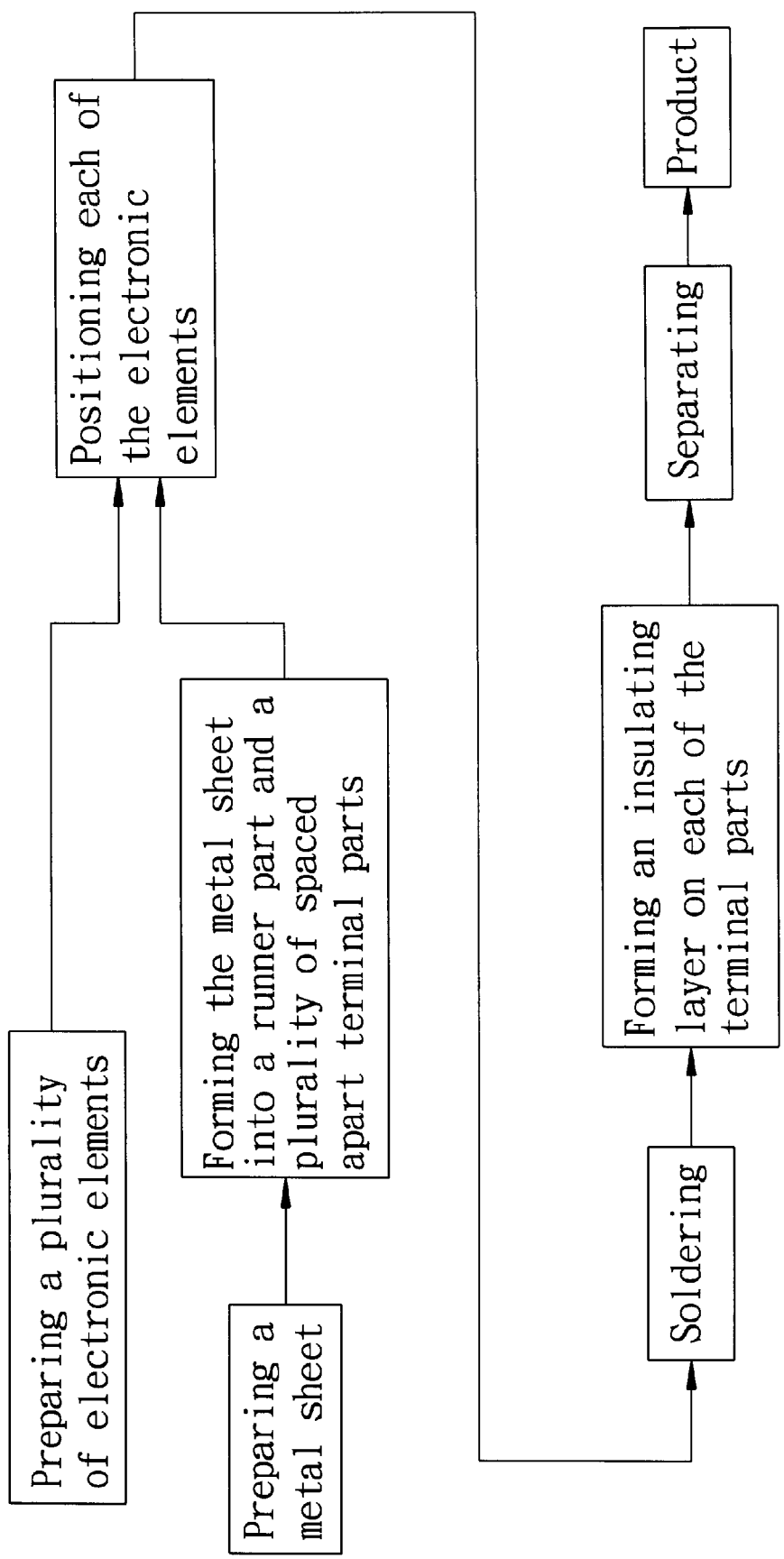
FIG. 7 is a flow diagram illustrating the preferred embodiment of the process for manufacturing electronic device packages according to this invention.

Referring to FIGS. 2 to 7, the preferred embodiment of the process for manufacturing electronic device packages according to this invention comprises the steps of:

(1) Preparing a plurality of electronic elements 10:
Each of the electronic elements 10 has two opposite side faces, and is formed with two electrode layers 11 on the side faces, respectively. The electronic element 10 is preferably in the form of a flat body, and can be a surge suppressor, a Y-type capacitor, a negative temperature coefficient (NTC) thermistor, a positive temperature coefficient (PTC) thermistor, a wave filter, or the like. In this preferred embodiment, the electronic element 10 is in the form of a flat circular body. The electrode layer 11 is made from a material, such as silver or palladium. The electrode layer 11 can be circular, square or other polygons in shape. In this preferred embodiment, the electrode layer 11 is circular in shape.

(2) Preparing a metal sheet 100 that extends in a longitudinal direction.

(3) Forming the metal sheet 100 into a runner part 40 and a plurality of spaced apart terminal parts 100':
The metal sheet 100 is formed into a runner part 40 and a plurality of spaced apart terminal parts 100' via any well-known technique, such as punching. The runner part 40 extends in the longitudinal direction and is formed with a plurality of positioning holes 41 for transport of the terminal parts 100' along the longitudinal direction during the subsequent processing stages. The spaced apart terminal parts 100' are connected to the runner part 40 and are aligned in the longitudinal direction. Each of the terminal parts 100' includes a pair of spaced apart connecting legs 20, 30 that have lower inserting sections 24, 34 connected to the runner part 40, and upper soldering sections 21, 31 which extend from the lower inserting sections 24, 34 and which are offset from each other in a transverse direction relative to the longitudinal direction so as to define an inserting gap therebetween. The lower inserting sections 24, 34 of the connecting legs 20, 30 of each of the terminal parts 100' are aligned along the longitudinal direction and are substantially flush with each other. Each of the upper soldering sections 21, 31 has a width greater than that of a respective one of the lower inserting sections 24, 34. The upper soldering sections 21, 31 of the connecting legs 20, 30 of each of the terminal parts 100' project toward each other in the longitudinal direction. The upper soldering sections 21, 31 and the lower inserting sections 24, 34 of the connecting legs 20, 30 of each of the terminal parts 100' cooperatively form a pair of spaced apart L-shaped shoulders 25, 35 so as to define the gap thereamong and so as to support a respective one of the electronic elements 10.

Additionally, the upper soldering sections 21, 31 of the connecting legs 20, 30 of each of the terminal parts 100' are formed with corrugated surfaces 23, 33. Each of the corrugated surfaces 23, 33 is formed with a plurality of grooves 22, 32 and a plurality of ridges 22', 32' that abut against a respective one of the electrode layers 11 on the side faces of the respective electronic element 10.

Preferably, the metal sheet is further formed with a plurality of connecting bridges 50, each of which extends between and interconnects the lower inserting sections 24, 34 of the connecting legs 20, 30 of each of the terminal parts 100', during formation of the runner part 40 and the terminal parts 100'.

(4) Positioning each of the electronic elements 10:
Each of the electronic elements 10 is positioned into the inserting gap in a respective one of the terminal parts 100' in a manner that the upper soldering sections 21, 31 of the connecting legs 20, 30 of the respective one of the terminal parts 100' confront the electrode layers 11 on the side faces of the electronic element 10, respectively. Since the runner part 40 acts as a conveyor to permit transport of the terminal parts 100', positioning of the electronic elements 10 into the inserting gaps in the terminal parts 100' and the subsequent processing steps can be easily conducted in an automated manner.

(5) Soldering:
The electronic elements 10, together with the upper soldering sections 21, 31 of the connecting legs 20, 30 of the terminal parts 100', are immersed in a bath that contains a soldering material. Then, the side faces of each of the electronic elements 10 are respectively connected to the upper soldering sections 21, 31 of the connecting legs 20, 30 of the respective one of the terminal parts 100' via soldering.

(6) Forming an insulating layer 60 on each of the terminal parts 100':
The electronic elements 10, together with the upper soldering sections 21, 31 of the connecting legs 20, 30 of the terminal parts 100', are immersed into another bath that contains a liquid insulating material, and are dried by baking. The insulating layer 60 is thus formed on each of the terminal parts 100' in a manner that the insulating layer 60 encloses a respective one of the electronic elements 10 and the upper soldering sections 21, 31 of the connecting legs 20, 30 of the respective one of the terminal parts 100' and that the lower inserting sections 24, 34 of the connecting legs 20, 30 of the respective one of the terminal parts 100' are exposed from the insulating layer 60.

(7) Separating:
The lower inserting sections 24, 34 of the connecting legs 20, 30 of each of the terminal parts 100' are separated from the runner part 40 by any cutting technique well known to those skilled in the art. Additionally, the connecting bridge 50 of each of the terminal parts 100' is also separated from the lower inserting sections 24, 34 of the connecting legs 20, 30 of the respective one of the terminal parts 100' during cutting so as to form the electronic device packages.

Figure 8:
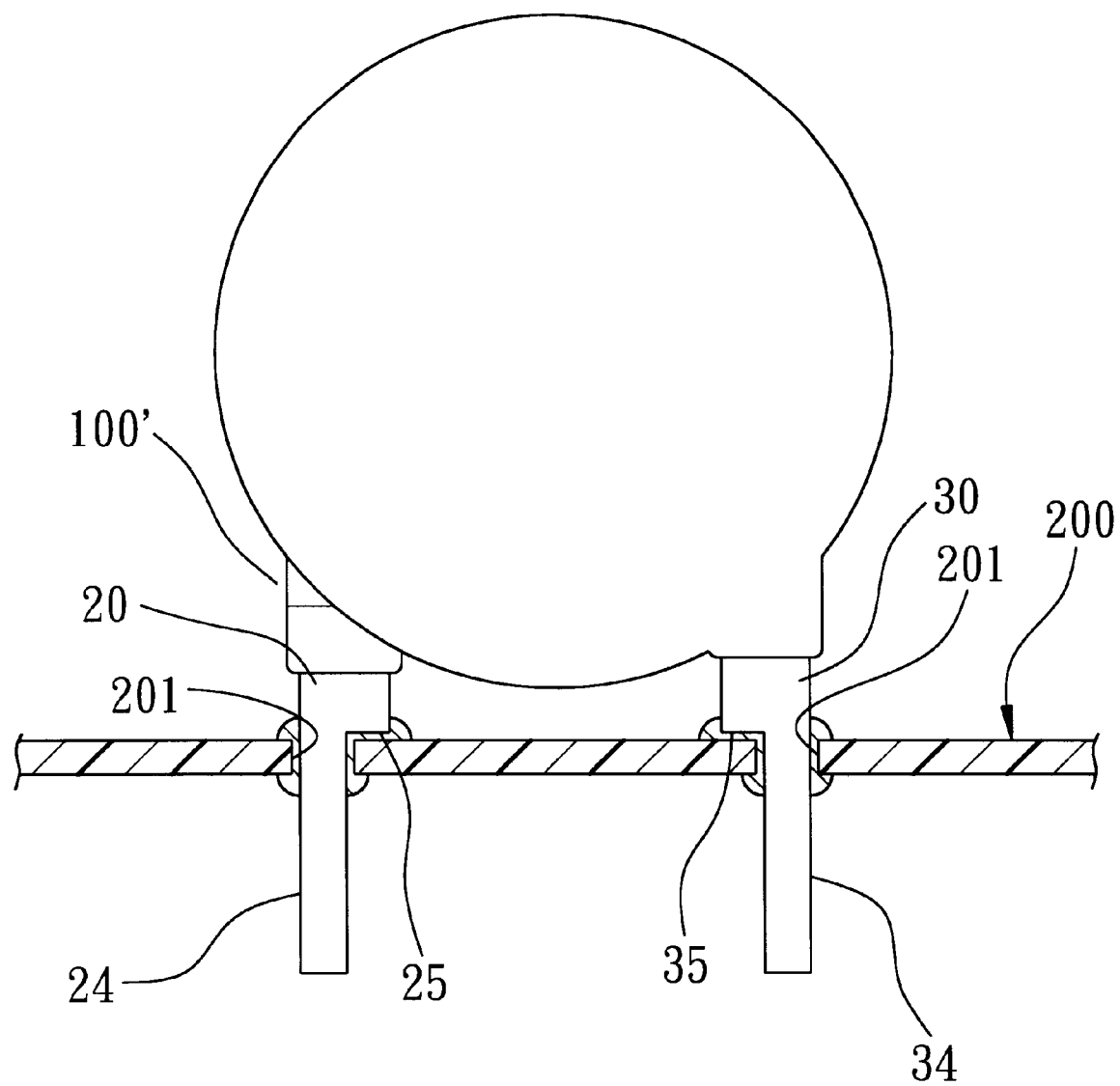
FIG. 8 is a schematic view showing the state of soldering the connecting legs of the electronic device package manufactured by the preferred embodiment of the process according to this invention onto a circuit board.

Referring to FIG. 8, the lower inserting sections 24, 34 of the connecting legs 20, 30 of the terminal parts 100' of the electronic device package can be extended through soldering holes 201 in a circuit board 200, and have have top ends defining two opposite neck portions which engage peripheries of the soldering holes 201 and which are soldered to the circuit board 200 so as to enhance positioning of the electronic device package on the circuit board 200.

Figure 9:
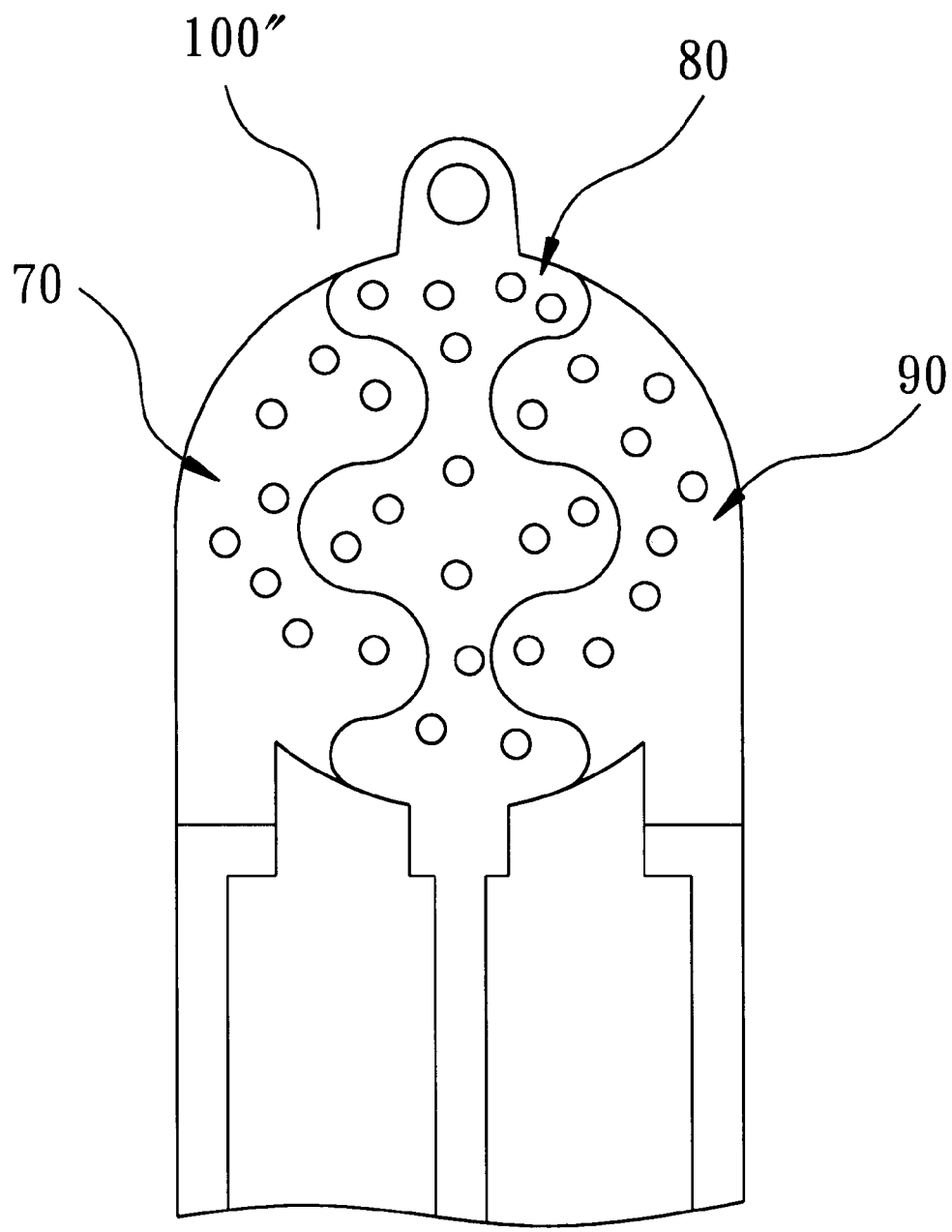
FIG. 9 is a schematic view of a metal sheet formed according to another preferred embodiment of the process for manufacturing electronic device packages of this invention.

Referring to FIG. 9, in another embodiment, each of the terminal parts 100'' formed on the metal sheet can have a configuration which includes three connecting legs 70, 80, 90. Two inserting gaps are respectively formed between two adjacent ones of the connecting legs 70, 80, 90 so as to position two electronic elements therein, respectively. Therefore, complex electronic device packages can also be produced by the process of this invention.

In view of the above, the process according to this invention can produce electronic device packages with stable qualities and superior soldering effects in a manner that facilitates automation and mass-production and that is cost-effective. Therefore, the aforesaid drawbacks of the prior art can be overcome, and the production yield of electronic device packages can be enhanced.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A process for manufacturing electronic device packages, comprising the steps of:
preparing a plurality of electronic elements, each of which has two opposite side faces and each of which is formed with two electrode layers on said side faces, respectively;
preparing a metal sheet extending in a longitudinal direction;
forming said metal sheet into a runner part that extends in said longitudinal direction, and a plurality of spaced apart terminal parts that are connected to said runner part and that are aligned in said longitudinal direction, each of said terminal parts including a pair of spaced apart connecting legs that have lower inserting sections connected to said runner part, and upper soldering sections which extend from said lower inserting sections and which are offset from each other in a transverse direction relative to said longitudinal direction so as to define an inserting gap therebetween;

positioning each of said electronic elements into said inserting gap in a respective one of said terminal parts in a manner that said upper soldering sections of said connecting legs of the respective one of said terminal parts confront said electrode layers on said side faces of said electronic element, respectively; and respectively connecting said side faces of each of said electronic elements to said upper soldering sections of said connecting legs of the respective one of said terminal parts via soldering wherein said upper soldering sections of said connecting legs of each of said terminal parts are formed with corrugated surfaces, each of which is formed with a plurality of grooves and a plurality of ridges that abut against a respective one of said electrode layers on said side faces of said electronic elements.

2. The process as claimed in claim 1, wherein said electronic elements are selected from the group consisting of surge suppressors, capacitors, thermistors and filters.

3. The process as claimed in claim 1, wherein said metal sheet is further formed with a plurality of connecting bridges, each of which extends between and interconnects said lower inserting sections of said connecting legs of each of said terminal parts, during formation of said runner part and said terminal parts.

4. The process as claimed in claim 1, wherein said metal sheet is formed into said runner part and said terminal parts via punching.

* * * * *